United States Patent [19]
Yu et al.

[11] Patent Number: 5,719,878
[45] Date of Patent: Feb. 17, 1998

[54] SCANNABLE STORAGE CELL AND METHOD OF OPERATION

[75] Inventors: Ruey J. Yu; Alfred L. Crouch, both of Austin, Tex.

[73] Assignee: Motorola Inc., Schaumburg, Ill.

[21] Appl. No.: 566,813

[22] Filed: Dec. 4, 1995

[51] Int. Cl.$^6$ ................................................ G01R 31/28
[52] U.S. Cl. .................... 371/22.3; 371/22.31; 327/202
[58] Field of Search ............................ 371/22.3, 22.1, 371/22.32, 22.31, 22.34, 22.5, 27.7; 307/272.2; 324/758, 158 R; 327/203, 202, 216, 217, 155

[56] References Cited

U.S. PATENT DOCUMENTS

| | | | |
|---|---|---|---|
| 5,130,568 | 7/1992 | Miller et al. | 307/272.2 |
| 5,260,949 | 11/1993 | Hashizume et al. | 371/22.3 |
| 5,317,205 | 5/1994 | Sato | 307/443 |
| 5,329,167 | 7/1994 | Farwell | 307/272.3 |
| 5,378,934 | 1/1995 | Takahashi et al. | 327/203 |
| 5,444,404 | 8/1995 | Ebzery | 327/185 |
| 5,463,338 | 10/1995 | Yurash | 327/202 |
| 5,471,152 | 11/1995 | Gheewala et al. | 324/758 |

Primary Examiner—Hoa T. Nguyen
Assistant Examiner—Nadeem Iqbal
Attorney, Agent, or Firm—Keith E. Witek

[57] ABSTRACT

Circuitry (20) and an associated an method of operation provides system data (30) and scan data (32) to a latch portion (42) of a data storage element in a reduced setup time period. For each data storage element, a system data transfer gate (22) provides system data (30) to a master latch portion (42) while a scan data transfer gate (24) provides scan data (32) to the master latch portion (42). The scan data (24) and system data transfer (22) gates minimize the set-up time required for data entering the data storage element. Scan chains incorporating the data storage elements include scan data input ports and scan data output ports as well as connections between data storage elements in an associated scan chain. A controller (26) operated by a scan enable signal (38) and a system clock (40) provide control signals to the system data transfer gate (22) and the scan data transfer gate (24) to cause the gates to selectively pass data. The controller 26 serves as a multiplexor function for scan data and system data, and serves a clocking loading minimizing function to speed the data path.

27 Claims, 10 Drawing Sheets

FIG. 4 —PRIOR ART—

SCANNABLE STORAGE CELL AND METHOD OF OPERATION

FIELD OF THE INVENTION

This invention relates generally to integrated circuitry and more particularly to a scannable storage cell and method of operation for scan testing integrated circuitry.

BACKGROUND OF THE INVENTION

The complexity of modern integrated circuitry (ICs) continues to increase at an dramatic rate. Modern integrated circuits include millions of transistors contained on a single substrate. In order to create the millions of transistors on the substrate, the size of each transistor has decreased dramatically. Thus, today, a single integrated circuit takes up less area, operates more quickly, and consumes less power than ever before. However, with the increase in transistor numbers on each integrated circuit, the likelihood that at least one transistor contained on the integrated circuit malfunctions after fabrication also increases. Thus, various testing methods have been developed to verify the operation of integrated circuits after fabrication but prior to sale.

One testing methodology involves providing a certain set of inputs to the integrated circuit over many clock signals, reading the outputs generated by the inputs, and comparing the outputs to expected results. When the outputs fail to correctly compare to the expected results, the integrated circuit has improperly functioned. However, in order to test each particular internal logic portion of the integrated circuit, a huge number of variations in inputs must be provided. When the output is not the correct output when designing the integrated circuit, a diagnostic engineer must still spend a huge amount of time to identify which malfunctioning transistor or set of malfunctioning transistors caused the error. Thus, in modern integrated circuits (ICs), the ability to test internal logic with standard functional or operational vectors is no longer cost efficient. The transistor-to-package pin ratio is typically too large to successfully verify the internal structure of the chip in a reasonable amount of vectors or test time.

For example, if there are 3 million transistors on an IC packed in a 300 pin package, an average of (3,000,000/300) =10,000 transistors must be tested by each pin in a best case. Thus, an the average, at least 10,000 voltage transitions must be applied to each pin in order to test the operation of each transistor in the IC in a best case. Further, many techniques that have been used to test and verify densely packed board designs cannot be used within the operation of the IC because there is no direct access to many of the circuits within the packaged and sealed IC.

As an alternative to prior testing techniques, the test technique of internal embedded scan design has become a cost effective solution to test the operation of ICs. Scan design is accomplished by altering the structure of standard flip-flops and latches (storage elements) within the IC into scan flip-flops and latches by providing a second alternate scan input for scan data parallel to the functional data input. The alternate input for scan data is generally implemented by placing a multiplexor in front of the standard input which selects either scan data or functional data. These "scannable" elements are then connected together in a serial shift register fashion by connecting the output of one element to the scan input of a next element via a "scan chain". The scan chain can load and unload internal IC state information by allowing scan data to be transferred from one element to another on each active clock edge when a scan enable signal is asserted.

The operation of ICs employing scan design may switch from the scan mode to the system mode at any clock cycle. In this fashion, a particular scan data sequence may be loaded into the scannable elements during scan mode, the particular sequence intending to produce a particular logic function outcome from the logic functions in the IC. Once the scan data sequence is loaded, the operation of the IC is switched to system mode for a single clock cycle, and the resulting system data is captured in the scannable elements. The IC is then placed in scan mode and clocked until the data is received at a serial output pin. The received data is then compared to expected results to verify the operation of the logic circuitry for the particular case. In this fashion, the operation of at least a portion of the logic circuitry in the IC may be verified even though this portion of the logic circuitry is internal to the IC and difficult to access directly via external pins of the IC.

By selectively loading scan data and varying clocking frequencies, the technique of providing scan data in scan mode and switching to system mode for a single clock cycle may be employed to determine the delay of portions of the logic circuitry in the IC. Scan data is first provided to the scan elements in the scan chain such that specific scan elements contain predetermined values. The predetermined values in the scan elements are selected so that specific results will be produced by the logic circuits receiving output from the scan elements and produced in connected scan elements. The predetermined values are selected so that the results produced in the connected scan elements differ from the values provided during scan mode. Thus, if the logic circuit functions properly, the data produced by the logic circuits will alter the values in the connected scan elements. However, if the logic circuits do not function within the clock period, the values in the respective scan elements will not change. Thus, by varying the scan data provided to the scan chain and also the frequency of operation, the inherent delay of particular logic circuits may be verified.

Thus, the scan design has the effect of turning each selected sequential scan device (flip-flop or latch) into an internal test point. In a typical scannable device, or for a flip-flop, the standard input is referred to as the D-input while the standard output is referred to as the Q-output. Thus, the D-input of each scannable device is a direct observable point, or primary output test point. Further, the Q-output or equivalent pin (such as Q) of each scannable device becomes a direct control point, or primary input test point.

As one skilled in the art will readily appreciate, not every storage element must be converted to a scan element to provide benefits through scanning. If all elements are converted, then the design is known as a full-scan architecture. However, if only selected storage elements are converted, then the design is known as a partial-scan architecture. If either full-scan or partial-scan is supported, the economics of testing improve. A scan architecture of any type allows each scanned sequential device to be viewed as if it were a package pin which reduces the gate/transistor-to-pin ratio (for example 3 million transistors in a 300 pin package with 10,000 scannable sequential elements has a figure of merit of 291 transistors per pin). Since the logic functions are more accessible, an IC incorporating a scan architecture requires fewer test vectors and less test time. A reduction in testing time results in a reduction in per device cost of manufacturing the IC.

The cost of testing an IC is one of the two largest recurring economic costs in IC design, with the cost of silicon being the other. Because of the tradeoff between "cost of test" and "cost of silicon", scan design is not universally accepted by all design organizations. The use of scan flip-flops instead of the smaller non-scanned flip-flops requires more silicon space and therefore increases the cost of silicon. Further, the routing of the scan chain adds wire connections and interconnection routing to the design which also increases silicon area.

Compared to non-scan flip-flops, prior art scan flip-flops had an associated performance penalty. The performance penalty resulted from the additional delay caused by a multiplexor that was required to multiplex the D-input pin of the scan flip-flop with the scan data input pin (SDI-input) of the scan flip-flop. As one skilled in the art will readily appreciate, such multiplexing required an additional three gates in series to accomplish the multiplexing. The multiplexor increased the transit delay time of system data passing between scan flip-flops and ultimately reduced the maximum frequency of operation of the IC during system mode. In some cases this meant that a part that would otherwise run at, for example, 100 MHz without scan test features could now only run at 92 MHz due to the added scan features. In another form, in order to make up for the performance penalty, larger drive cells were used to minimize the propagation delay penalty. However, these larger drive cells also incurred a silicon area penalty. Therefore, a new scan flip-flop is required to reduce these problems.

In one prior art implementation of the scan flip-flop, a multiplexor resides at the D pin input to the flip-flop. Scan data and system data is multiplexed through the multiplexor and provided to the flip-flop. In the scan mode, the multiplexor allowed scan data to pass from one flip-flop to another flip-flop within a scanned chain. However, in the system data mode of operation, system data is provided through the particular logic network leading to the multiplexor. The inclusion of the multiplexor on the input side of the flip-flop increases the physical size of the scan flip-flop. Further, the logic circuitry required to implement the multiplexing construction from the scan flip-flop adds additional delay time to the propagation signals through the combination of the multiplexor and scan flip-flop. Thus, the frequency of operation of devices incorporating the particular flip-flop structure having multiplexors at the input is decreased due to the additional overhead of the multiplexor. This delay is not acceptable to most high speed, market competitive microprocessors.

One particular methodology for providing a scan architecture within an IC that did not reduce the performance of the IC during system mode is implemented by International Business Machines (IBM) and is referred to as the level sensitive scan design (LSSD). In the LSSD architecture, a plurality of clocks are provided to each of the scan flip-flops. The scan flip-flops are separated into scan latches wherein each scan flip-flop comprises both a master and a slave latch. The plurality of clock signals are provided separately to the master and slave latches so that data may be provided to each during differing modes of operation. During a system mode of operation of the LSSD architecture, system data is provided to the master latch and the master latch is clocked to receive the data with a master clock signal. Further, during the system operation of the LSSD architecture, a system slave clock causes the system slave latches to receive the system data.

During a scan mode of operation of the ICs containing the LSSD scan architecture, a scan slave clock is used to operate a plurality of scan slave latches that are operably connected to the master latches to receive data only during the scan mode. In effect, a third latching element is added to the existing master and slave latches which comprises a complete scan element. Because of this third latching element, the LSSD scan architecture consumes a significant amount of substrate surface area.

Further, in order to increase the speed of operation of the IC during system mode, the LSSD architecture often grouped the placement of the scan slave latches (third latching element) in a group away from the master latches and system slave latches. Thus, the length of the lines connecting the scan slave latches to the respective and subsequent master latch were great after placement and routing of the IC design. Due to the great length of the signal paths that the scan data had to transverse, the frequency of operation of an IC incorporating the LSSD architecture during scan mode was typically a small fraction of the frequency of operation of the IC incorporating the LSSD architecture during system mode. Thus, the scan mode could not be used to directly verify the operation of the logic circuits within the IC at various clocking frequencies.

Thus, there exists a need in the art for scan elements that do not limit the frequency of operation of the associated IC (improved scan routing is needed) and a need in the art for a method of construction of individual scan circuits and flip-flops that facilitates the verification of an integrated circuit in a more time efficient manner.

DETAILED DESCRIPTION OF THE DRAWINGS

The present invention relates to an apparatus and method for providing scan data to a latch portion of a storage data element. Further, the invention relates to a storage element incorporating such teachings. The apparatus preferably includes a plurality of data transfer gates that provide data to a master portion of a flip-flop. The data transfer gates minimize the set-up time required for data entering the data storage element. Because the set-up time requirements for providing data have been reduced, both system data and scan data are received by the storage element in an optimized manner. The design of scan chains incorporating the data storage elements are also optimized in accordance with the present invention to reduce scan testing times required to verify the operation of the IC in which the scan chain is installed. Further, due to its increased speed of operation, the structure of the present invention increased verification capabilities. In order to reduce the silicon area penalty and performance penalty associated with the scan design, the scan design must be optimized. Routing of signals between scan elements must be optimized by constructing a scan chain wherein each scan element in a scan chain is its nearest neighbor on the silicon. Thus, the scan chain path lengths are reduced as well as the associated cost. However, when the length of the scan chain between adjacent scan elements in the scan chain is too short, scan data may transmit to a next scan element before the system clock has transitioned, thus incorrectly "smearing" data through the scan chain and invalidating results.

Figure 1:
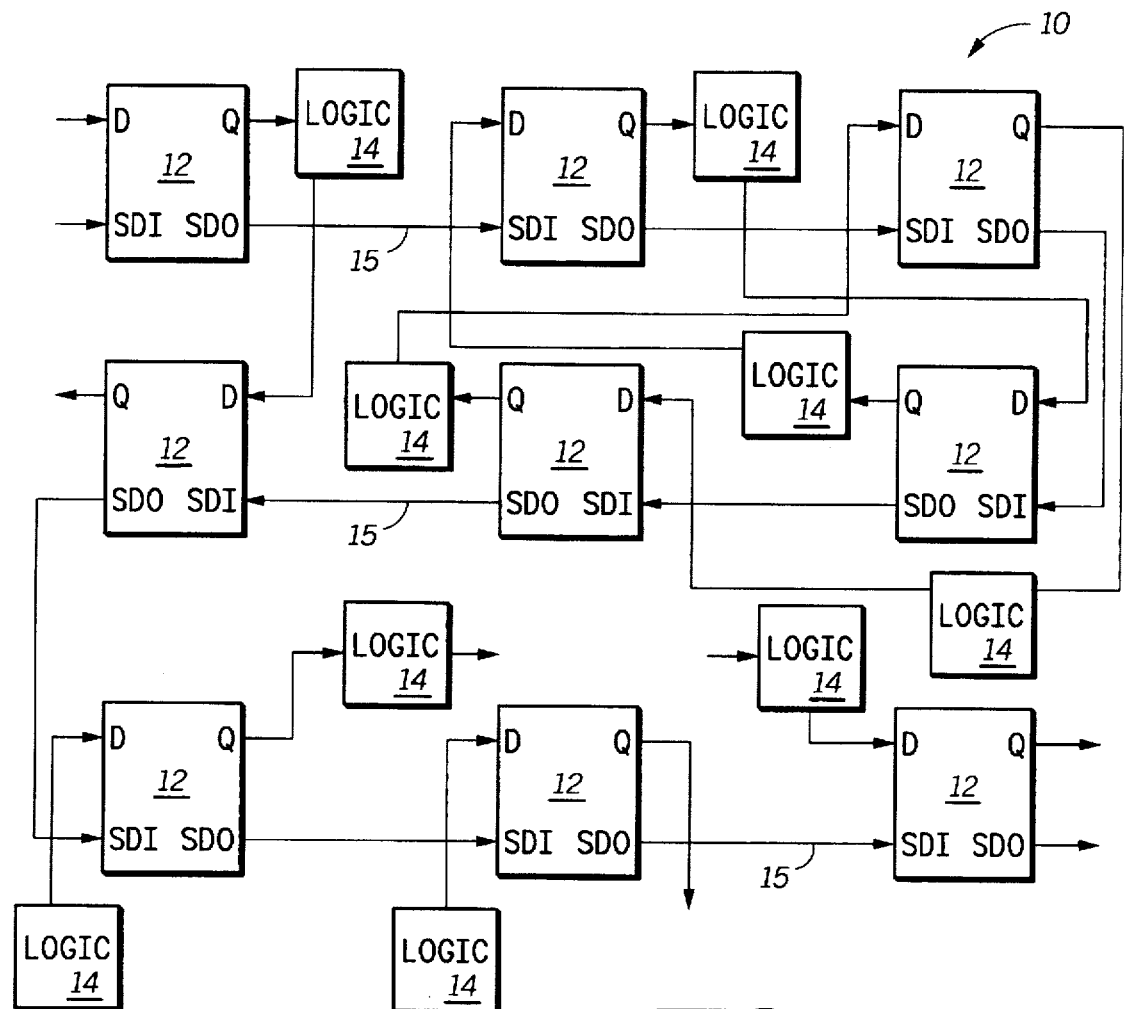
FIG. 1 is a block diagram illustrating a scan path architecture after first optimizing the functional paths in a place and route tool and subsequently adding the scan paths in accordance with the teachings of the present invention.

FIG. 1 illustrates an integrated circuit 10 including a plurality of scannable scan flip-flops 12 in a scan chain. In FIG. 1, the D flip-flops are scan flip-flops that are placed and routed in a place and route tool and optimized to ensure that the D-to-Q functional connections are operating at maximal performance and speed. This optimization is done without the inclusion of scan paths (SDI/SDO paths) since scan path optimization simultaneous with functional path optimization results in both the scan path and functional path being less than optimal. Once the functional paths are optimized without scan paths and the D flip-flop positions are set via the functional optimization of the IC, the scan connections are inserted in a raster-scan or row column manner. This subsequent insertion of scan lines between close D flip-flops after functional optimization allows functional units or modules within the IC to have, for example, 100 MHz normal operation and at speed >=100 MHz scan operation. In some cases, buffer or drivers need to be added in the scan path between devices or modules in the IC to further speed the scan path. In other words, functional connections are optimized first and then scan is inserted in a rastered manner so that both scan and functional operation are maximized in speed and efficiency.

In FIG. 1, the plurality of scan flip-flops 12 receive system data at their D-input and provide output at their Q-output in a functional/normal mode of operation. Each of the scan flip-flops 12 receives its input through a unique logic function 14. The logic functions 14 provide for the logical operation of the integrated circuit 10 via interconnected logic gates such as AND, NAND, inverter, OR, NOR, transistors, and like logic devices. Each of the scan flip-flops 12 also receives scan data at scan data input port (SDI) and provides scan data at a scan data output port (SDO). As one skilled in the art will readily appreciate, during a "scan mode" of operation of the integrated circuit, serial scan data is provided to each of the scan flip-flops 12 through scan data paths 15 as is illustrated. However, during a "system mode" of operation or "normal mode" of operation, the flip-flops receive data at their D-inputs via the logic functions 14.

Each clock cycle within the integrated circuit 10, when in a "scan mode", allows the serial scan data to proceed serially from one scan flip-flop 12 to the next scan flip-flop 12 in the scan data chain. In this fashion, scan data may be sequentially loaded to a first scan flip-flop 12 in the chain and provide throughout each scan flip-flop 12 in the chain until the serial scan data is provided as an output at the last scan flip-flop 12 in the chain. When in the scan mode, the basic operation of each of the scan flip-flops 12 in the scan data chain may be verified. The scan data chain may further be used to test the correctness of operation of each the logic circuits 14. By selectively loading a particular serial scan data sequence of logical 1's and 0's and shifting from the scan mode of operation and the system mode of operation, the logical operation of a particular logic function 14 may be verified by one or more clock cycles. As one skilled in the art will readily appreciate, such a scan data structure as is disclosed in FIG. 1 may be used to verify the logical operation of the integrated circuit 10.

When the scan enable signal is deasserted, the scannable elements operate in a "system mode". In system mode, the scannable elements 12 capture system data at their D-inputs at each clock cycle. Standard logic circuitry 14 provides the system data to each scannable element and facilitates the logical operation of the IC. As one skilled in the art will readily appreciate, the input of a particular scannable element 12 will be provided by a particular logic function 14, the logic function 14 receiving as inputs the outputs of various scannable elements (Q-outputs) as well as system inputs. The logic function 14 will then perform a combinational logic function on the inputs to produce a logic function output and provide the logic function output as input to the scannable element. FIG. 1 illustrates the row formation of scan lines inserted after functional optimization for maximal scan and functional performance.

Figure 2:
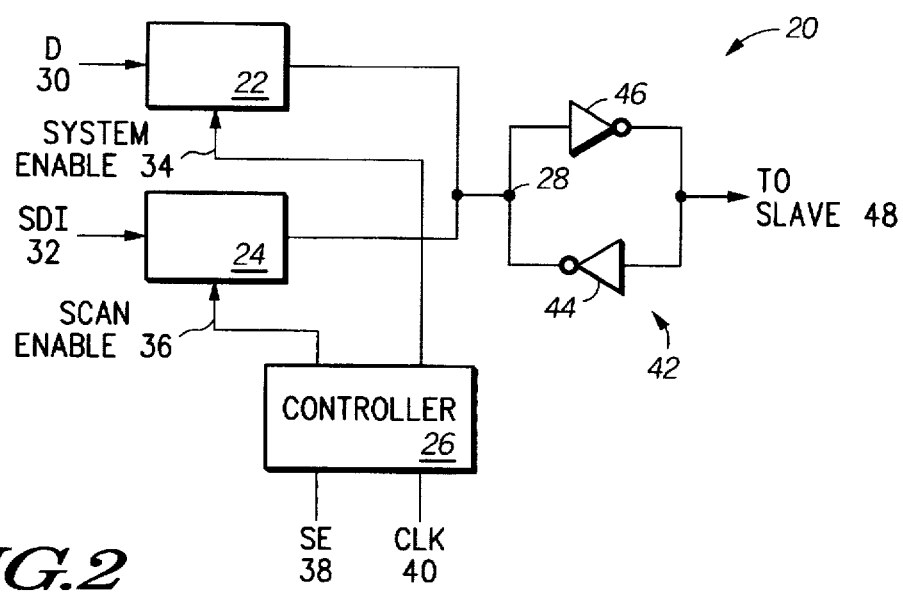
FIG. 2 is a block diagram illustrating an apparatus for providing scan data to a latch portion of a data storage element in accordance with the teachings of the present invention.

FIG. 2 illustrates an apparatus 20 for providing scan data to a master latch portion 42 comprising inverters 44 and 46 wherein the master latch portion is part of a scan data storage element. See FIG. 4 wherein a typical master latch portion 42 comprises some type of circular coupled inverter elements such as elements 44 and 46. Preferably, the data storage element is one of a plurality of data storage elements in a digital circuit, wherein the data storage elements receive data, both system data and scan data, in accordance with the principles described in conjunction with scan chain design of FIG. 1.

The apparatus 20 preferably comprises a system data transfer gate 22, a scan data transfer gate 24, and a controller 26. Each gate 22 or 24 may contain only one logic gate/transistor or may contain a plurality of interconnected logic gates/transistors. The system data transfer gate 22 operably couples to an input 28 of the latch portion 42. The system data transfer gate 22 receives system data (D) 30, and selectively passes the system data (D) 30 to the master latch portion 42 based upon a system data transfer enable signal 34. Preferably, the system data transfer gate 22 comprises a transmission gate (which is a parallel coupled N-channel transistor and a P-channel transistor). However, the system data transfer gate 22 could comprise any circuit element performing a gating function.

The scan data transfer gate 24 operably couples to the input 28 of the latch portion 42. The scan data transfer gate 24 receives scan data input, SDI 32, and selectively passes the scan data to the latch portion 42 based upon a scan data transfer enable signal 36. Preferably, the scan data transfer gate 24 comprises a transmission gate. However, the scan data transfer gate 24 could comprise any circuit element performing a gating function.

The controller 26 operably couples to the system data transfer gate 22 and the scan data transfer gate 24. The controller 26 provides the scan data transfer enable signal 36 to the scan data transfer gate 24 upon receipt of a scan enable signal, SE 38. The controller 26 otherwise provides the system data transfer enable signal 34 to the system data transfer gate 22. Thus, the operation of the controller 26 provides output signals from the system data transfer gate 22 and the scan data transfer gate 24 in a mutually exclusive manner based upon the scan data transfer enable signal 38. Preferably, the controller 26 also receives a clock signal 40 that allows the operation of the apparatus 20 to coincide with the system clock. The controller preferably is constructed of combinational digital circuit elements. One skilled in the art will readily appreciate the various circuits that may be employed to perform the requisite functions of the controller 26.

Preferably, the master latch portion 42 comprises a latch as is known in the art, the latch comprising a first inverter 44 operably coupled to a second inverter 46 to provide a latching function. However, the master latch portion 42 could comprise other circuits that also provide a latching function. An output of the latch portion 42 is provided to a slave latch portion 48 not shown in FIG. 2 but otherwise known in the art for master-slave type flip-flops. Other flip-flops and configurations other than a master-slave configurations may also be used herein to store a binary value of data.

Preferably, the apparatus 20 as illustrated in FIG. 2 further includes a multiplexor coupled to the input of the system data transfer gate 22. The multiplexor selectively provides the system data transfer gate 22 with an output of the slave 48 and the system data 30. Therefore, a hold function can be enabled for the master portion 42 and the slave portion 48 wherein the logic output of the slave is retained as the same logic output for many clock cycles. This technique of using a hold function is useful for low power products.

The apparatus 20 illustrated in FIG. 2 provides many important advantages over the prior art. Because the apparatus 20 provides system data D 30 through the system transfer gate 22 and scan data SDI 32 through the scan data transfer gate 24, the requirement of including a multiplexor (with much more delay time) at the input of latch portion 42 is eliminated. The elimination of the multiplexor for multiplexing the system data 30 and the scan data 32 reduces the set-up time associated with the latch portion 42, and also reduces the circuitry needed to selectively provide system data D 30 and scan data SDI 32 to the master latch portion 42. The reduction in circuitry reduces the area required to construct the circuit on a substrate. Further, because the effective length of the circuitry passing the system data D 30 has been reduced for each storage element, the frequency of operation of the integrated circuit in which the present invention is incorporated increases accordingly. Further, because of the reduction in circuitry resulting from the incorporation of the teachings of the present invention, the power consumption of the apparatus 20 is reduced as compared to the prior art circuits performing the same function.

Figure 3:
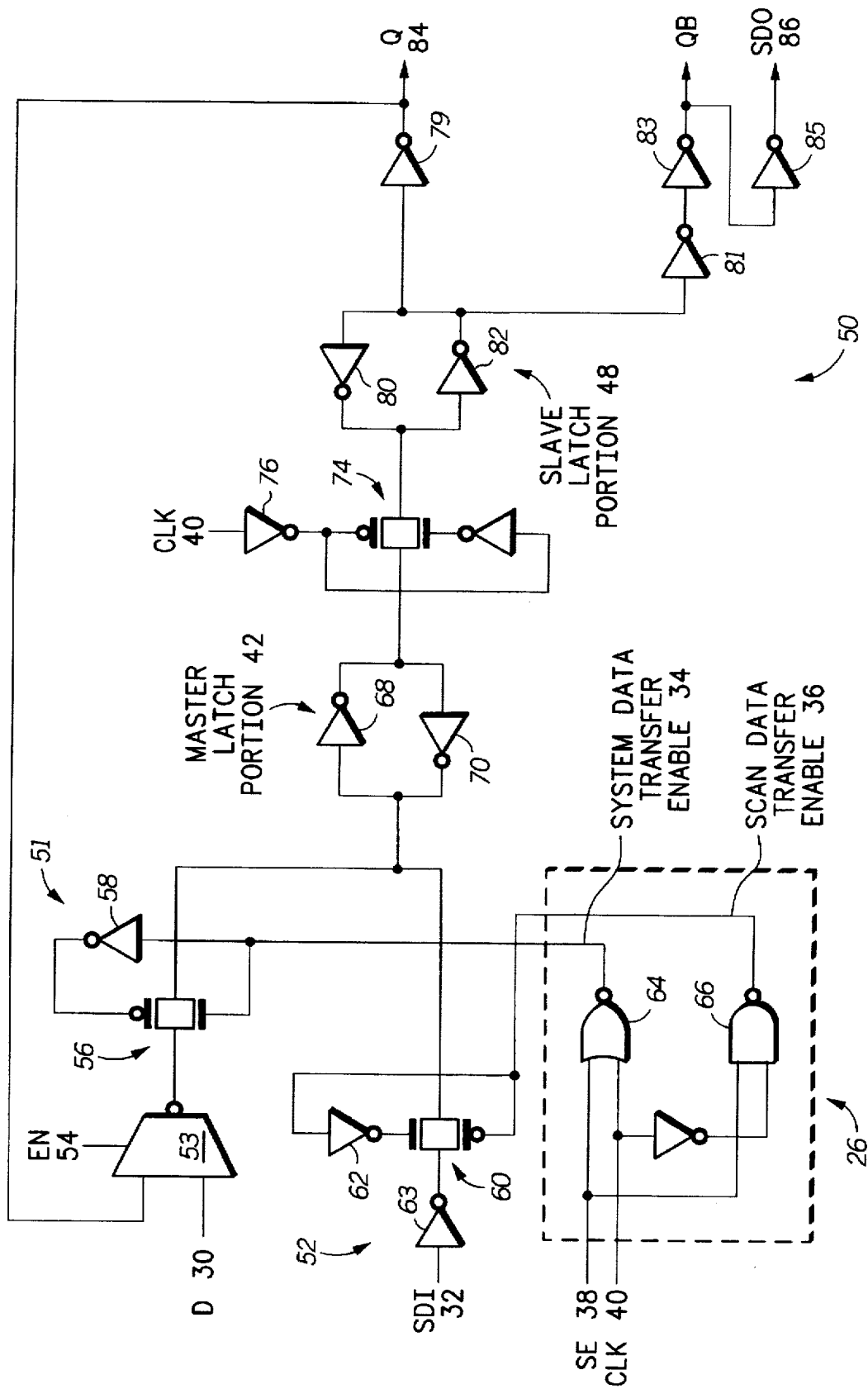
FIG. 3 is a schematic diagram illustrating a storage cell incorporating the principles of the present invention.

FIG. 3 illustrates a storage cell 50 comprising latch portions 42 and 48, first transfer gate 51, second gate transfer gate 52, and controller 26. The total binary storage latch portion preferably comprises a master latch portion 42 and a slave latch portion 48 as illustrated. The master latch portion 42 preferably comprises an inverter 68 and an inverter gate 70 operably coupled to provide a feedback latching function. In another form the inverter gate 70 may be a NOR gate 70 further including a clear input where an assertion of the clear signal to a logic high value drives the contents of the master latch portion 42 to logic 0. This clear signal would provide an asynchronous reset to the master latch portion 42 of the storage cell 50. Asynchronous and synchronous resets signals are optional in a scan chain design.

The slave latch portion 48 comprises a first inverter 80 and a second inverter 82 operably coupled to provide a latching function. Coupling the master latch portion 42 to the slave latch portion 48 is a transfer gate (T-gate) 74 operated by clock signal 40. Clock signal 40 is provided to a P-channel transistor of the T-gate 74 through at least one inverter 76 and provided to an N-channel transistor of the T gate 74 through 2 inverters to reduce clock loading. The operation of the T-gate 74 via the clock signal 40 provides the contents of the master latch portion 42 to the slave latch portion 48 upon a rising edge of the system clock. Alternately, a different system can be designed to latch data into portion 42 on a falling edge by changing the inverter from the P-channel to the N-channel transistor in the T-gate 74. In this case, the clock polarity used to generate control signals (such as signals 34 and 36 in FIG. 2) would have to be inverted.

The first transfer gate 51 has an input for receiving a data signal and an output operably coupled to an input of the master latch portion 42. The first transfer gate 51 also receives a first control input, the first control input being the system data transfer enable signal 34. The first transfer gate 51 preferably comprises a T-gate 56 having both an N-channel and a P-channel transistor coupled in parallel as illustrated. The system data transfer enable signal 34 is provided directly to the N-channel transistor of the T-gate 56 while an inverted representation of the system data transfer enable signal 34 is provided to the P-channel transistor and the T-gate 56 through an inverter 58. In this fashion, when the system data transfer enable signal 34 is logic high, the first transfer gate 51 conducts its input to its output. Thus, the first transfer gate 51 is "on" during a logic high level of the system data transfer enable signal 34. Logic low signals can also be used in a similar design.

Provided as an input to the first transfer gate 51 are the system data signal D 30 and a Q-signal 84 which is the output of the latch portion 48. A set signal can also be input into the mux 53, but this feature is optional and not illustrated in FIG. 3. The data signal D 30 is provided directly to the MUX 53.

Enable signal 34 selectively provides either the D signal 30 or the Q 84 signal to the first transfer gate 51. During the operation of a storage cell 50, the device may be placed into a hold function wherein the contents of the storage cell 50 are retained for one or more additional clock cycles. During such an operation, the enable signal EN 54 is asserted to a logic low level such that the contents of the storage cell 50, signal Q 84, are provided through the multiplexor 53 to the first transfer gate 5 1.

As one skilled in the art will readily appreciate, the methodology used in the present invention for providing both a synchronous set signal and the asynchronous clear signal may be implemented in a differing method. The particular methodologies used in conjunction with the present invention are performed for illustration purposes only and may be performed in various other manners.

The second transfer gate 60 has an input that receives a scan signal SDI 32 through an inverter 63 while an output of the second transfer gate operably couples to the input of the master latch portion 42. The second transfer gate 60 is controlled via a second control input, the second control input preferably the scan data transfer signal 36 produced by the controller 26. The second transfer gate 52 preferably comprises a T-gate having an N-channel transistor and a P-channel transistor as illustrated. Scan data transfer enable signal 36 is provided directly to the P-channel transistor of the T-gate 60 while an inverted representation of the scan data transfer enable signal 36 is provided to the N-channel transistor of the T-gate 60.

The controller 26 provides the first control signal to the first control input of the first transfer gate 51 during a first time period, the first time period corresponding to the time that the system data transfer enable signal 34 is active high. The controller 26 further provides a second control signal to the second control input of the second transfer gate 60 during a second time period, the second time period corresponding to the time that the scan data transfer enable signal 36 is active high. The first time period is different from the second time period such that the time periods do not overlap (i.e., they are mutually exclusive in time). In this fashion, at any time, only a single data path provides data to the master latch portion 42. It is important to note that slight differences in processing, gate size, delay time through conductors, etc., may result in a very small picosecond overlap of the control signals 34 and 36. This small overlap, although not desired, is tolerable.

Preferably, the controller 26 comprises a first NOR gate 64 and a NAND gate 66. The first NOR gate receives a system clock signal 40 and the scan enable (SE) signal 38. The first NOR gate 64 provides the system data transfer enable signal 34 to the first transfer gate 51. The NAND gate receives an inverted system clock signal 40 and a scan enable signal 38. The NAND gate 66 therefore provides the scan data transfer enable signal 36 which corresponds to the second signal provided to the second transfer gate 60 during the second time period.

It is important to note that the NAND gate 66 and the T gate 60 are functionally correct in FIG. 3 to illustrate logical operation. However, the NAND gate 66 and the T gate 60 are implemented in FIG. 5 as a complex gate labeled as gate 60, 66. The complex gate 60, 66 is used to reduce clock loading on the clock signal so that the clock operation is not adversely affected.

Because of the inputs provided to the first NOR gate 64 and the second NOR gate 66, the system data transfer enable signal 34 and the scan data transfer enable signal 36 will never both be at a logic high level during the same time period. Thus, there is no significant overlap in time period where both the first transfer gate 51 and the second transfer gate 52 are enabled. Thus, the controller 26 provides the important function of providing only one particular input to the master latch portion 42 during a single time period and prevents contention at the input of the master latch portion 42.

The storage cell 50 of FIG. 3 could also comprise additional circuitry for providing inverted slave latch portion 48 contents as an output referred to as Q or QB as illustrated via the inverters 81 and 83. This output could be provided as either system dam or as scan data output 86. As one skilled in the art will readily appreciate, the storage cell 50 illustrated in FIG. 3 may incorporate various additional features without departing from the scope of the present invention.

The master latch portion 42 and slave latch portion 48 may comprise portions of various flip-flop types, the various flip-flop types potentially being D flip-flops, T flip-flops, RS flip-flops and a JK type flip-flop. As one skilled in the art will readily appreciate, the teachings in the present invention can be applied equally to any of the various types of flip-flops that are known in the art. Thus, the circuit of FIG. 3 provides the important benefits of reducing overhead relating to the input of the storage cell 50. In this fashion, the system data is input to the master latch portion 42 of the storage cell 50 through a minimized length data path. Therefore, the frequency of operation of the integrated circuit comprising the storage cells 50 as illustrated in FIG. 3 may be increased. Further, because of the reduced overhead in the scan data path for providing scan data to the master latch portion 42 the operation of the scan data portion of the integrated circuit may also be optimized.

The particular storage cell structure 50 of FIG. 3 could be incorporated into a scan chain. The scan chain is not illustrated in conjunction with the present invention but merely described in conjunction with the latch structures illustrated in FIGS. 2 and 3 with the system structure illustrated in FIG. 1. The scan chain would preferably include a scan data input port for receiving serial scan data, a plurality of serially coupled flip-flops constructed in accordance with those structures of FIG. 2 and FIG. 3, and have an overall construction similar to the scan chain illustrated in conjunction with FIG. 1. A last flip-flop in the scan data chain would provide output to a scan data output port. As one skilled in the art will readily appreciate, the particular storage cell structures illustrated in FIG. 2 and FIG. 3 could easily be included in a scan chain incorporating the teachings of the present invention as well as those known in the prior art.

FIG. 3 illustrates a scan data output SDO 86 formed by coupling an inverter 85 to the QB output.

Figure 4:
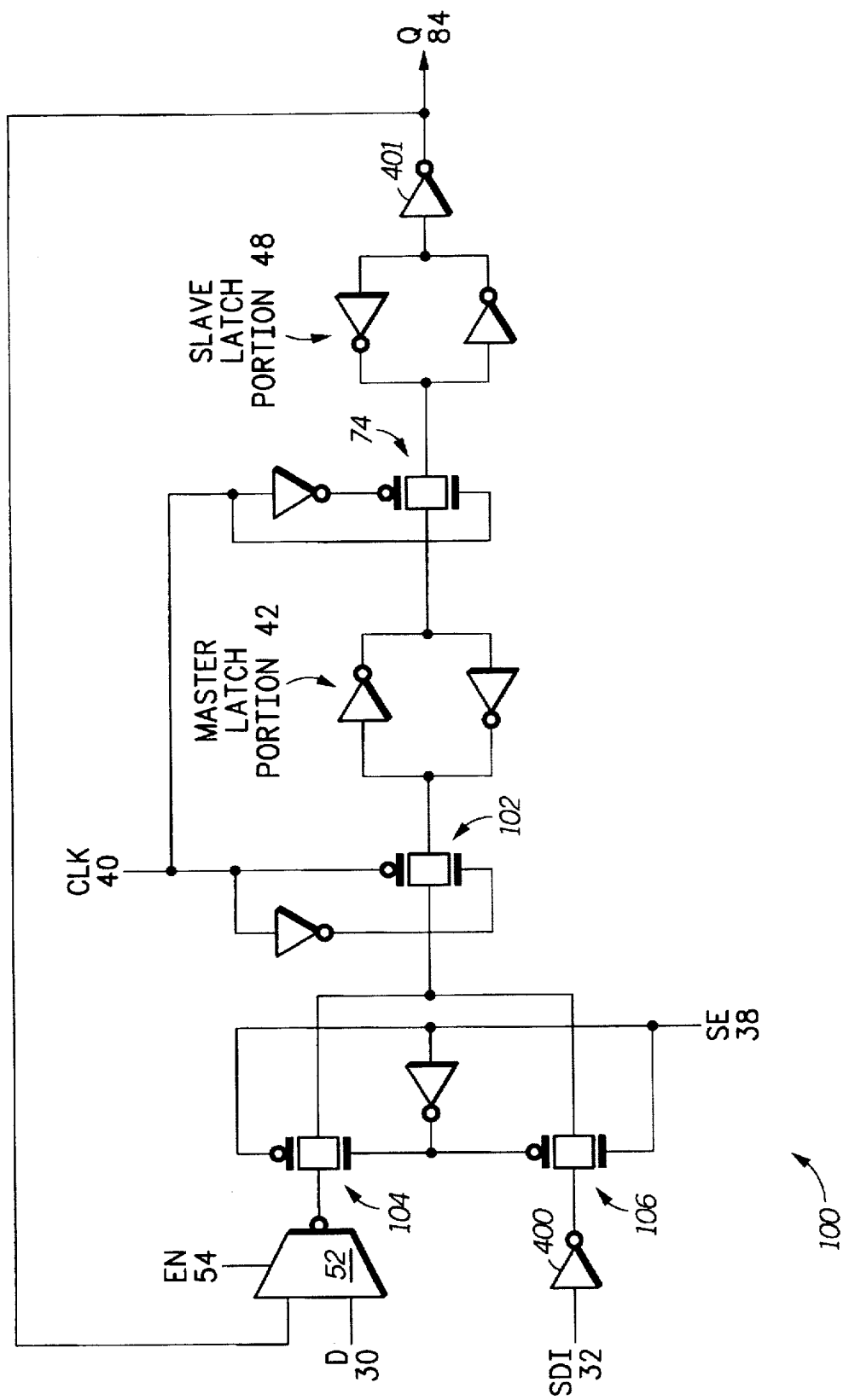
FIG. 4 is a schematic diagram illustrating an alternate storage cell known in the prior art.

FIG. 4 illustrates a storage cell 100 comprising a master latch portion 42, first transfer gate 102, second transfer gate 104, multiplexor 52, and operable coupling 106, in a configuration known in the art. The master latch portion 42 preferably has an input and an output as illustrated. The master latch portion 42 preferably comprises a standard latch including two operably coupled inverters. The master latch portion 42 is preferably coupled to a slave latch portion 48 through transfer gate 74. The transfer gate 74 is operated by clock signal 40 to provide the master latch portion contents 42 to the slave latch portion 48 upon a rising edge of the clock 40. The first transfer gate 102 has an input and an output wherein the output is operably coupled to the master latch portion 42. The first transfer gate 102 receives as a first control input the clock signal 40. Thus, the first transfer gate transfers its input to the master latch portion 42 upon a falling edge of the clock 40.

The second transfer gate 104 has an input operably coupled to the output of the multiplexor 52 and an output operably coupled to the input of the first transfer gate 102. The second transfer gate 104 receives as a control input a scan enable signal 38. The second transfer gate 104 receives the scan enable signal 38 such that, on a logic low level of the scan enable signal 38, the second transfer gate 106 conducts to transfer the multiplexor 52 output to the first transfer gate 102 input.

The multiplexor 52 receives two inputs, the system data input (D) 30 and the slave latch portion 48 contents Q 84.

The multiplexor 52 is preferably an inverting multiplexor as illustrated in the embodiment of FIG. 4. Further, in order to ensure that the logical polarity is correct and to provide additional current drive or noise reduction, inverters/drivers 400 and 401 are included in FIG. 4 as is known in the art. The multiplexor provides input to the second transfer gate 104 and is operated by MUX enable signal EN 54. During a system data mode of operation, the enable signal EN 54 is preferably logic high so that the system data (D) 30 is passed through the multiplexor 42 to the second transfer gate 104. However, when a hold function is provided to the storage cell 100, the enable signal EN 54 is logic low and the contents of the slave latch portion 48, Q 84, are provided through the multiplexor 52 to the first transfer gate 102 input. It is also important to note that the inverter 400 of FIG. 4 can be made into a clocked inverter (such as that illustrated via element 406 in FIG. 13) to further reduce power consumption.

The operable coupling 106 preferably comprises a transmission gate enabled by the scan enable signal 38. Preferably, the transmission gate 106 is coupled to the scan enable signal 38 such that it conducts on an opposite logic level of the scan enable signal than controls the second transfer gate 104. The transmission gate 106 receives the scan data input 32 as an input and provides the scan data 32 to the input of the first transfer gate 102 when the scan enable signal 38 is logic high.

The circuit of FIG. 3 is superior to the circuit of FIG. 4 since the set-up path of the D input is FIG. 4 comprises the MUX 52, the T-gate 104, and the T-gate 102 which results in a large D set up time. However, the D set up path of FIG. 3 contains only the MUX 53, and the T-gate 56. Therefore, the circuit of FIG. 3 has a reduced D set-up time when compared to the known circuit of FIG. 4. This reduced set up time is very advantageous and allows designers to put more logic in between successive D flip-flops in the IC design.

Figure 5:
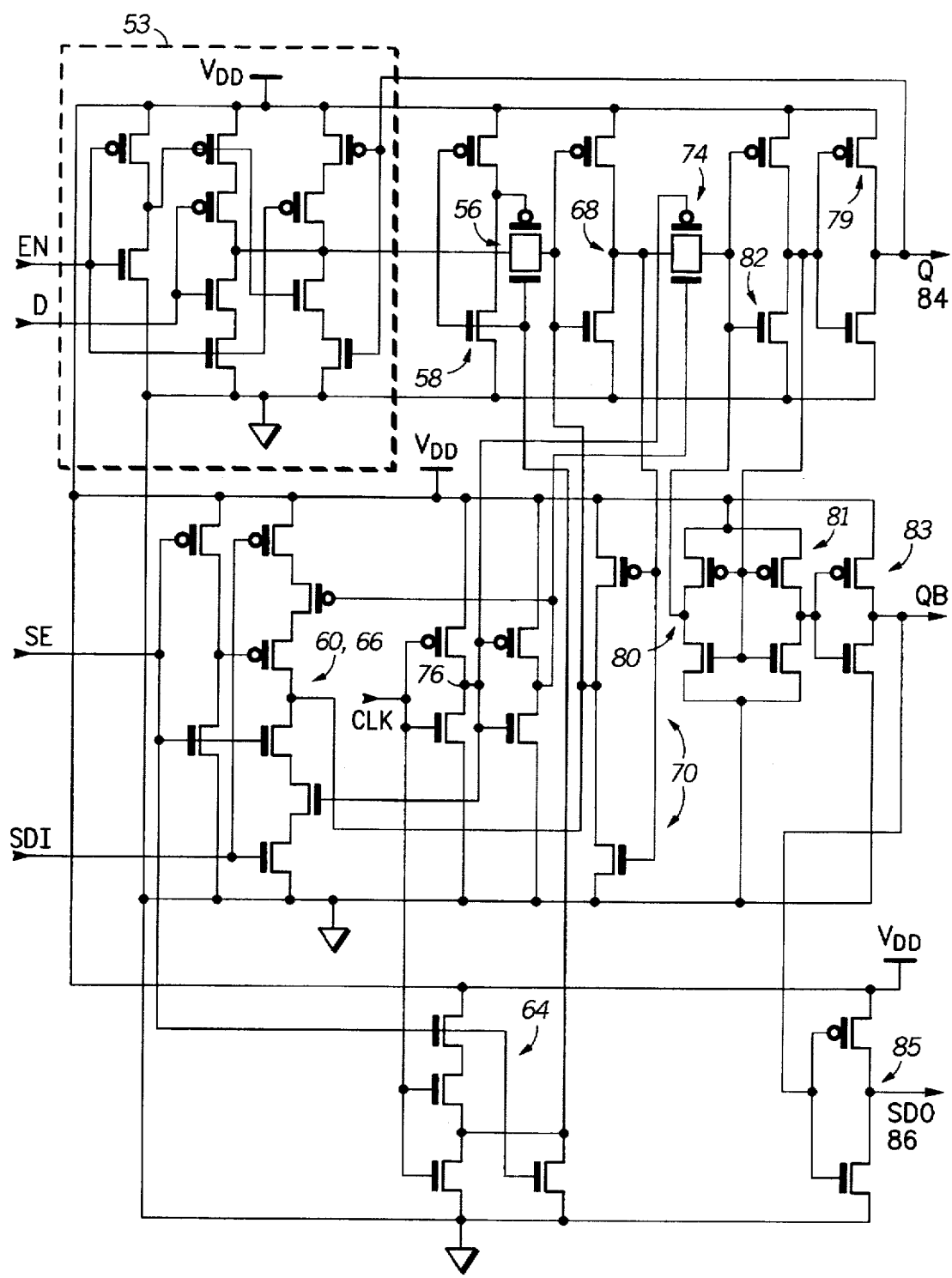
FIG. 5 is a transistor-level schematic diagram illustrating a storage cell in accordance with the present invention.

FIG. 5 illustrates a transistor level implementation of FIG. 3 to further show the improved D flip-flop set up time and the reduction of clock loading. FIG. 5 illustrates the MUX 53, the inverter 58, the T-gate 56, the inverter 68, the T-gate 74, the inverter 82, the inverter 79, the inverters 81, 81, and 85, the inverter 70, the NOR 64, the inverter 76, the inverter/NAND complex gate 66 and 60, and all other relevant circuitry of FIG. 3.

Figure 6:
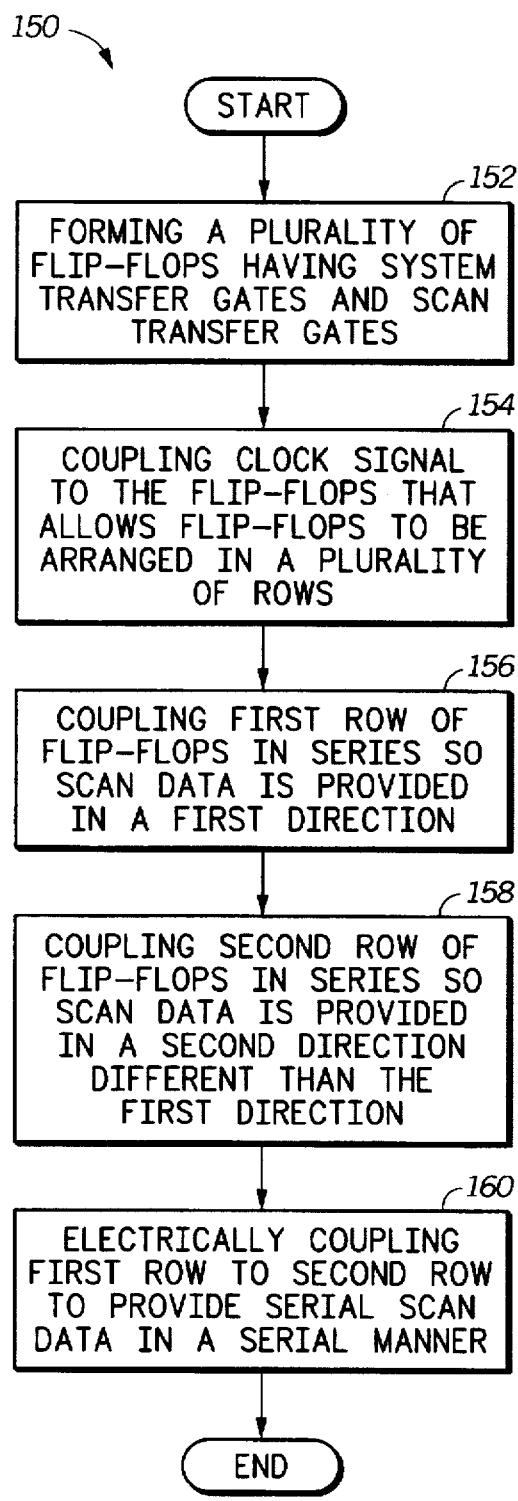
FIG. 6 is a logic diagram illustrating a method for making a scannable integrated circuit in accordance with the principle of the present invention.

FIG. 6 illustrates a method 150 for making a scannable integrated circuit. The method 150 includes as a first step 152 forming a plurality of flip-flops in the scannable integrated circuit. Contained within step 152 is the limitation that at least a portion of the plurality of the flip-flops receive system data via system transfer gates and serial scan data via scan data transfer gates. Preferably, the construction of the system transfer gates and serial scan data transfer gates is in accordance with the structures illustrated in FIG. 2 through FIG. 5. Thus, the method 150 and step 152 require a certain structure providing input to the flip-flops of the scannable integrated circuit.

Next, at step 154, the method includes coupling a clock signal to each of the plurality of flip-flops via a clock tree conductive structure. The clock tree conductive structure preferably distributes the clock signal in a manner which allows flip-flops to be arranged on the integrated circuit in a plurality of rows wherein each row contains a subset of the plurality of flip-flops. Next, at step 156, the method includes coupling each flip-flop in a first row of a plurality of rows in series that the serial scan data is provided to the first row of flip-flops in a serial manner in a first direction. At step 158, the method includes coupling each flip-flop in a second row of a plurality of flip-flops in series such that serial scan data is provided to the second row of flip-flops in a serial manner in a second direction. The second direction is substantially opposite the first direction. Finally, at step 160, the method includes electrically coupling the first row to the second row so that the serial scan data is serially scanned through the first and second row in a serial manner to verify the operation of the flip-flops.

Thus, the method 150 illustrated in FIG. 6 provides the important advantages of having a scannable integrated circuit designed such that scan data is provided to the plurality of flip-flops associated with the integrated circuit in an organized fashion such that the scan data paths are optimized. In this manner, the frequency of operation of the scannable integrated circuit during a scan mode is greater than that of the prior art scannable integrated circuits. Further, the construction of the scannable integrated circuit in accordance with the method 150 illustrated in FIG. 6 reduces the area required to create the circuitry associated with scan portion of the integrated circuit. Finally, the construction of the flip-flops in accordance with the method 150 reduces the delay time associated with each flip-flop thus allowing the integrated circuit to be operated at a higher frequency when in a system mode of operation. Thus, these benefits reduce the cost of the integrated circuit, the size of the integrated circuit, and the power consumption of the integrated circuit while allowing the integrated circuit to operate at a relatively higher frequency.

When interconnecting D flip-flops in steps 156 and 158, the scan data path between each set of serially connected flip-flops is checked for propagation delay. If the propagation delay is too great, then one of two methods may be used to correct the deficiency. In one form, a repeater flip-flop can be added roughly half way into the path to reduce the long delay into two smaller delays. In a second form, a driver circuit may be added to the front to the long path to reduce its time delay.

Preferably, the propagation delay between each flip-flop in the first row is such that the transmission path between adjacent flip-flops in the first row results in a propagation delay having a magnitude less than a period of a clock signal minus the set-up time of the flip-flop but greater than a maximum skew rate of the clock signal. By having the delay period of each of the data paths in the scan chain greater than the maximum skew rate of the clock signal, the design prevents data from passing directly through the master portion of the flip-flop to the slave portion of the flip-flop before the previous contents of the master portion of the flip-flop have been passed to the slave portion of the flip-flop. The erroneous passage of data prematurely to the slave portion is often called "data smearing." Thus, the limitation on the propagation delay of the scan path between flip-flops prevents such data smearing.

Further, by having the scan data path length optimized such that the propagation delay is less than a period of the clock signal minus the set-up time of the flip-flop, it is guaranteed that the frequency of operation of the integrated circuit during scan mode is at least as great as the frequency operation of the integrated circuit during system mode. In this fashion, the scan architecture of the integrated circuit may be used to verify the speed of operation of logic paths within the scannable integrated circuit. By loading a chain of scan data into the flip-flops of the scannable integrated circuit and switching between scan mode and system mode, the operation of logic functions between flip-flops may be tested on a time basis to guarantee their maximum delay time. As one skilled in the art will readily appreciate, by requiting that the scan circuitry of the scannable integrated circuit must operate at a frequency at least as great as the system frequency of operation during a system mode, the ability to scan system to verify the timing of the logic portions is guaranteed.

Preferably, the method 150 also includes providing a clock signal to each of the flip-flops in the scannable integrated circuit through an optimized clock tree conductive structure. The clock tree conductive structure is designed such that each of the flip-flops is provided with a clock signal from a clock tree signal source such that a distance of propagation from the clock signal source to each of the plurality of flip-flops propagates or substantially equal delay path length. In this fashion, skew in the clock signal as it arrives at each of the flip-flops is minimized.

Figure 7:
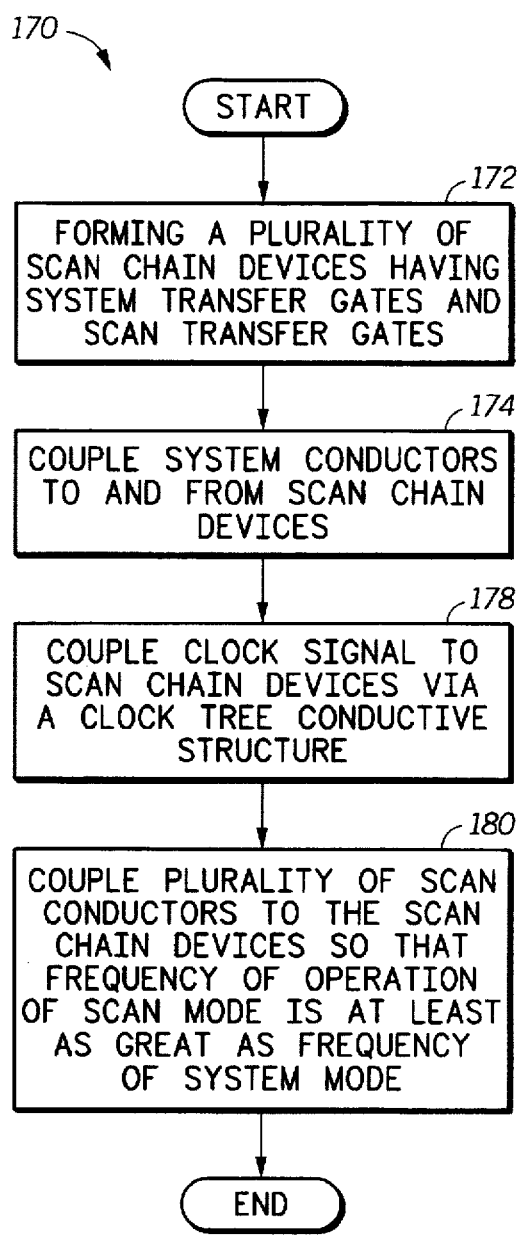
FIG. 7 is a logic diagram illustrating an alternative method for making an integrated circuit in accordance with the present invention.

FIG. 7 illustrates a method 170 for making an integrated circuit incorporating the principles of the present invention. At step 172, the method 170 includes forming a plurality of scan chain devices on an integrated circuit. At least a portion of the plurality of scan chain devices receive system data via system transfer gates and serial scan data via scan data transfer gates. The structure of the system transfer gates and scan data transfer gates as well as the flip-flops in which they reside has been previously described with respect to FIGS. 2 through 5.

At step 174, the method includes coupling a plurality of system conductors to the scan chain devices wherein the system conductors communicate system data to and from the scan chain devices when in a system mode of operation. One skilled in the art will readily appreciate that the coupling of scan chain devices to one another includes the incorporation of logical circuits to implement the desired logic functions of the integrated circuit. As was previously described with reference to FIG. 1, the logical circuits coupling the various scan chain devices preferably comprises combinational logic circuit elements. The design and connections of such logical circuitry are known in the art and are not further described herein other than is required to describe the operation of the present invention.

Next, at step 178, the method 170 includes coupling a clock signal to each of the plurality of scan chain devices via a clock tree conductive structure. Preferably, the clock tree conductive structure distributes the clock signal in a manner which allows the scan chain devices to be arranged on the integrated circuit in a plurality of rows. Preferably, each row of the plurality of rows contains a subset of scan chain devices of the plurality of scan chain devices. Further, step 178 preferably includes coupling the clock signal via the clock tree structure such that the clock signal is provided over the clock tree structure from a clock signal source point to each of the plurality of flip-flops over a substantially equal propagation delay path length. The requirement results in a minimum skew clock signal being received by the plurality of scan chain devices.

Next, at step 180, the method 170 includes coupling a plurality of scan conductors to the scan chain devices. The scan conductors communicate scan data to and from the scan chain devices when in the scan mode of operation. A frequency of operation of the scan mode of operation when shifting data into the scan chain devices is greater than or equal to a frequency of operation of a non-scan mode operation. In this fashion, the relatively higher frequency of operation of the scan mode of the integrated circuit allows for reduced testing time of the integrated circuit. Further, the relatively higher frequency of operation of the scan mode of the integrated circuit allows for the scan mode to be used in determining delay times of the logic circuits within the integrated circuit. In a preferred embodiment of the present invention, the scan mode of operation is greater than or equal to 90 MHz. However, the teachings of the present invention are not limited to the 90 MHz frequency level and could easily be applied to integrated circuits operating at much higher frequencies. Thus, to achieve the required delay between scan chain elements, the routing of signals between adjacent scan chain devices must be carefully performed. One skilled in the art will readily appreciate that such routing may be performed with any of the readily available routing tools when provided with the delay requirements.

In a preferred mode of the method 170 of the present invention, no conductors of the second plurality of conductors overlap each other. In this fashion, the wiring of the plurality of scan conductors is more easily optimized according to the criterion described above. It is also preferred that no portion of the clock tree conductive structure overlays any other portion of clock tree conductive structures. With such a limitation, the minimization of the clock skew is more easily accomplished. Further, the requirement of non-overlapping conductors reduces noise as well as complexity in the design of the integrated circuit.

Thus, the method 170 illustrated in FIG. 7 provides the benefits previously discussed with reference to FIG. 6 but also provides the benefits of incorporating a conductive clock tree structure within the integrated circuit. The method 170 also benefits from requiring that the circuit operates in scan mode at a frequency greater than or equal to the frequency of operation in the circuit during a system mode of operation. The benefit realized relates to reduced testing time as well as increased functionality of the scan mode operation of the integrated circuit.

Figure 8:
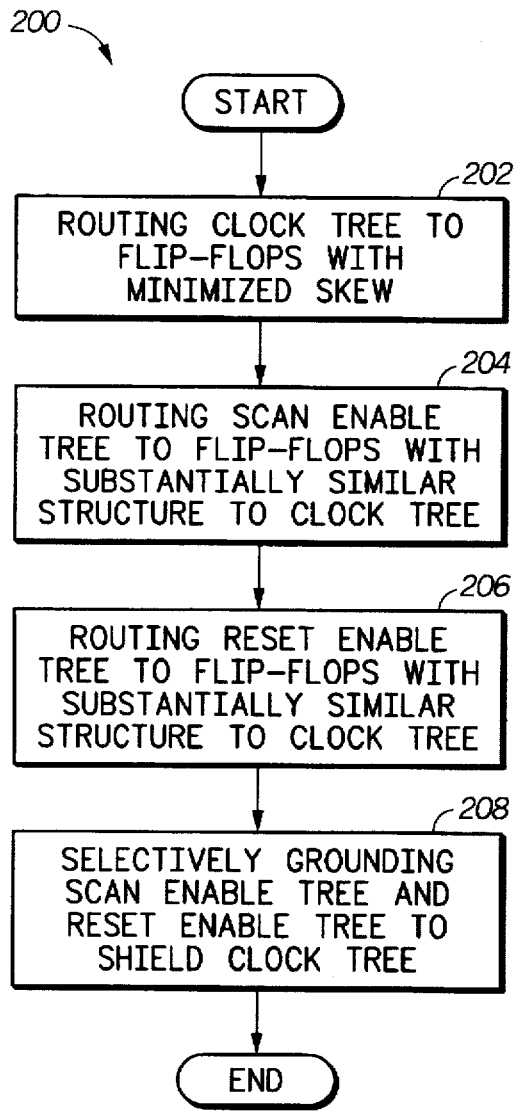
FIG. 8 is a logic diagram illustrating a method for routing signals in a scannable integrated circuit in accordance with the present invention.

FIG. 8 illustrates a method 200 for routing signals in a scannable integrated circuit. The method 200 includes, as a first step 202, routing a clock tree to each flip-flop in a multi flip-flop scan chain formed on the scannable integrated circuit. According to the routing required in step 202, each flip-flop is supplied with a minimized skew clock signal. As was previously described, such is most easily accomplished by causing the propagation length of each path within the clock tree structure from the source to the flip-flop to be substantially equal. As is known in the art, structures such as the "H-tree" structure accomplish such minimization of skew using a relatively simple design methodology. However, the present invention is not limited to the H-tree structure but simply requires that the clock provided to each flip-flop have a minimized skew. A minimum skew clock signal could be provided using various other structures as well.

Next, at step 204, the method 200 includes routing a scan enable tree to each flip-flop. The scan enable tree is substantially identical in structure to the clock tree such the scan enable tree is in close proximity to the clock tree throughout substantial portions of the integrated circuit. As one skilled in the art will readily appreciate, the scan enable tree could have an H-tree structure in one mode of construction or operation and various other structures as well.

Next, at step 206, the method 200 includes routing a reset enable tree to each flip-flop wherein the reset enable tree is substantially similar to the clock tree. In this fashion, the scan enable tree is in close proximity to the clock tree throughout substantial portions of the integrated circuit.

With the reset enable tree as well, the structure will be similar in design to the clock tree. Therefore, if the clock tree is an H-tree, the reset enable tree will be an H-tree as well. However, the structure of the reset enable tree is not limited to H-tree structures and could take various other forms.

Finally, at step 208, the method 200 includes selectively grounding the scan enable tree and reset enable tree. As one skilled in the art will readily appreciate, grounded lines in close proximity to a signal line provide shielding from noise to the signal line. Thus, the selective grounding of the scan enable tree and the reset enable tree, those structures having a similar structure to the clock tree structure and in close proximity of the clock tree structure, provide the important benefit of shielding the clock tree structure.

As one skilled in the art will further appreciate, the grounding of the scan enable tree and reset enable tree provides great benefits during the system mode of operation of the integrated circuit. Since the system mode of operation of the integrated circuit provides the benchmark for performance of the integrated circuit, by shielding the clock signal using the scan enable lines and reset lines, the integrated circuit may be operated at a higher frequency due to the reduced noise on the system clock. Further, the integrated circuit may be operated at higher temperatures and in noisier environments than the circuit could be integrated without the shielding effect of the closely coupled lines. Thus, the methods of the method 200 of FIG. 8 provide the important benefit of increasing the performance of the related integrated circuit.

Figure 9:
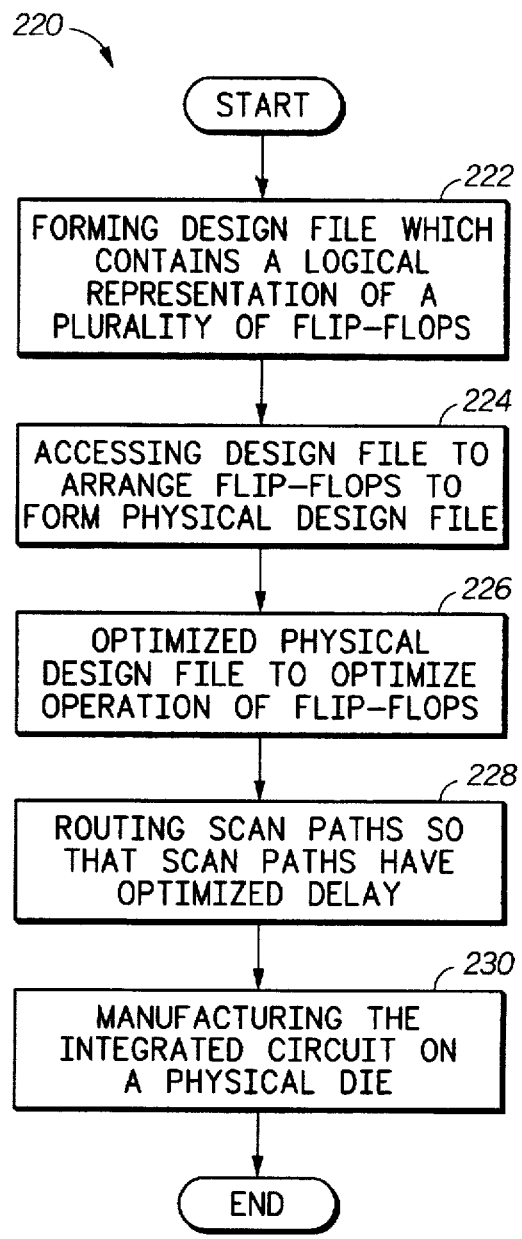
FIG. 9 is a logic diagram illustrating a method for manufacturing a scannable integrated circuit in accordance with the present invention.

FIG. 9 illustrates a method 220 for manufacturing a scannable integrated circuit. The method 220 includes as a first step 222 forming a design file which contains a logical representation of a plurality of flip-flops. The plurality of flip-flops are interconnected through logic gates for forming, at least in part, the functional operational circuitry of the scannable integrated circuit. Next, at step 224, the method includes accessing the design file via a place and route tool. The place and route tool arranges the plurality of flip-flops onto a two-dimensional substrate area to form a physical design file of an integrated circuit die. The integrated circuit die contains a plurality of flip-flops.

Next, at step 226, the method includes optimizing the physical design file so that the flip-flops are placed onto the integrated circuit die. Included in the step is optimizing the physical design file so that the functional operation is optimized as well. During optimization no scan paths are considered. However, the routing of the signals performing the logical functions within the integrated circuit die are optimized so as to maximize the operational frequency of the integrated circuit die.

Next, at step 228, the method includes routing the scan paths between flip-flops in the integrated circuit die after the step of optimizing so that the scan paths can serially shift scan data at a frequency greater than or equal to the frequency of the functional operation optimized by the step of optimizing the physical design file. Step 228 preferably requires that scan paths have a delay less than a period of a system clock minus the set-up time of the flip-flops but greater than a maximum skew rate of the system clock. In this fashion, the design guarantees that no data smearing will occur but also guarantees that a frequency of operation during a scan mode of the integrated circuit manufactured by the method will be at least at great as the frequency of operation of the system mode of the integrated circuit. Finally, at step 230, the method includes manufacturing the integrated circuit onto a physical substrate. Thus, the method 220 illustrated in FIG. 9 produces a scannable integrated circuit in accordance with the principles of the present invention.

The integrated circuit constructed in accordance with the steps of the method 220 includes optimized operation during the system mode of operation and operation during scan mode sufficient to obtain the desired goals.

Figure 10:
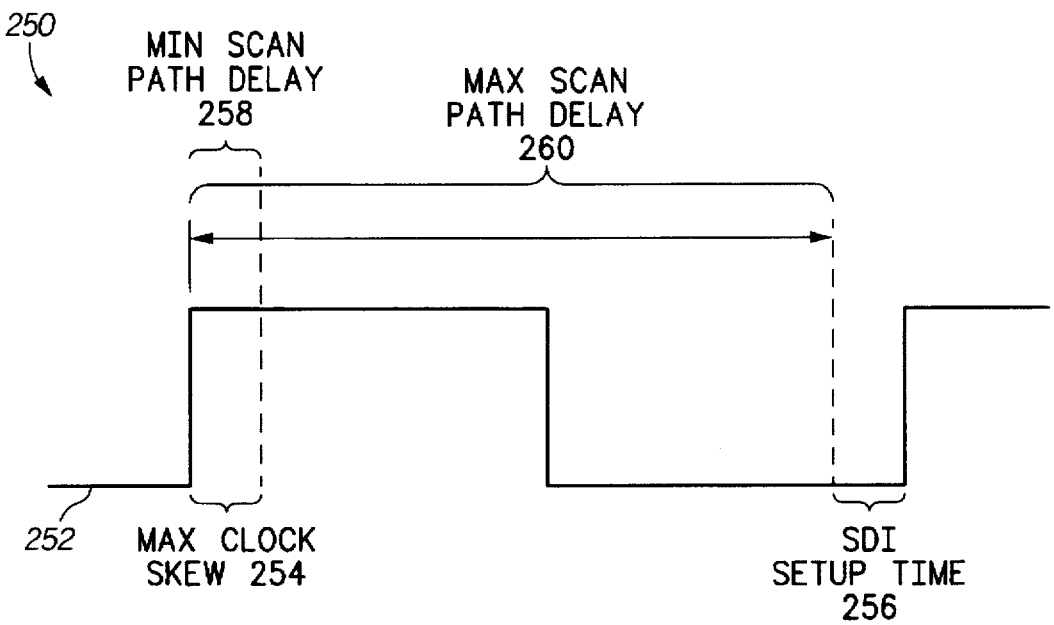
FIG. 10 is a timing diagram illustrating a transit time of a scan path length of a scan data path in accordance with the principles of the present invention.
Figure 11:
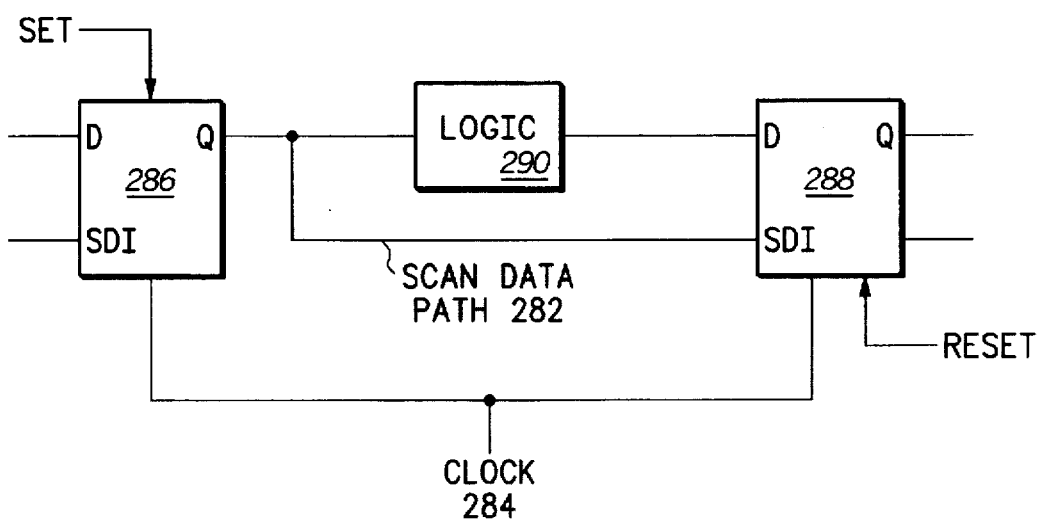
FIG. 11 is a block diagram illustrating the design of a scan path in accordance with the timing requirements of FIG. 10.

FIG. 10 illustrates a timing diagram showing the desired scan path delay with respect to a period of the system clock. FIG. 11 illustrates a block diagram of scan data paths, logic elements, and adjacent flip-flops.

With specific reference to the timing diagram 250 of FIG. 10, a system clock signal 252 has a period inversely proportional to the frequency of the system clock 252. The maximum clock skew rate 254 of the system clock is viewed from the point of the flip-flops receiving system clocking signals. The maximum skew rate 254 of the system clock signal 245 depends upon various factors such as the stability of the clock signal generator, the length of the propagation paths from the clock signal generator and the flip-flops, the relative propagation velocity of the clock signal along various portions of a clock tree structure, the symmetry of the clock tree structure, and various other factors.

With reference to both FIG. 10 and FIG. 11, a scan data path 282 between a first flip-flop 286 and an adjacent flip-flop 288 provides the scan data between the flip-flops. Further, between the flip-flops is logic circuitry represented by 290 that performs a portion of the logic of the integrated circuit in which it resides. The clock signal 252 is provided via clock structure to the flip-flops, the clock being represented as 284.

Within each of the flip-flops are transmission gates operated by the clock signal 252. As was discussed with reference to FIGS. 2 through 5, the scan enabling circuitry within the scan paths must be enabled prior to the latching of scan data from one flip-flop to another flip-flop. The time period in which the flip-flops' scan enabling circuitry becomes enabled is referred to as the scan data input setup time or "SDI setup time." Further, as was previously discussed, prior flip-flops requiring multiplexors in the scan path required relatively longer SDI setup times than do the flip-flops described with reference to FIGS. 2 through 5.

With reference to FIG. 10, in accordance with the present invention, each scan data path 282 has a length such that a transmission delay of the scan data path is at a minimum the scan path delay 258. The minimum scan path delay 258 is equal to the maximum clock skew rate 254. Further, the scan data path 282 has a maximum scan path delay 260. The maximum scan path delay 260 is equal to or less than the period of the system clock 252 minus the SDI set-up time 256. The requirement of the minimum scan path delay time 258 and the maximum scan path delay time 260 guarantees that data will not be smeared during operation and that the frequency of operation of the scan data portion of the integrated circuit will be at least as great as the frequency of operation of the integrated circuit during a system mode.

Thus, the scan data paths 282 may be designed at various differing lengths, as long as the minimum scan path delay 258 and maximum scan path delay 260 are satisfied. In this fashion, the benefits as described are provided.

Figure 12:
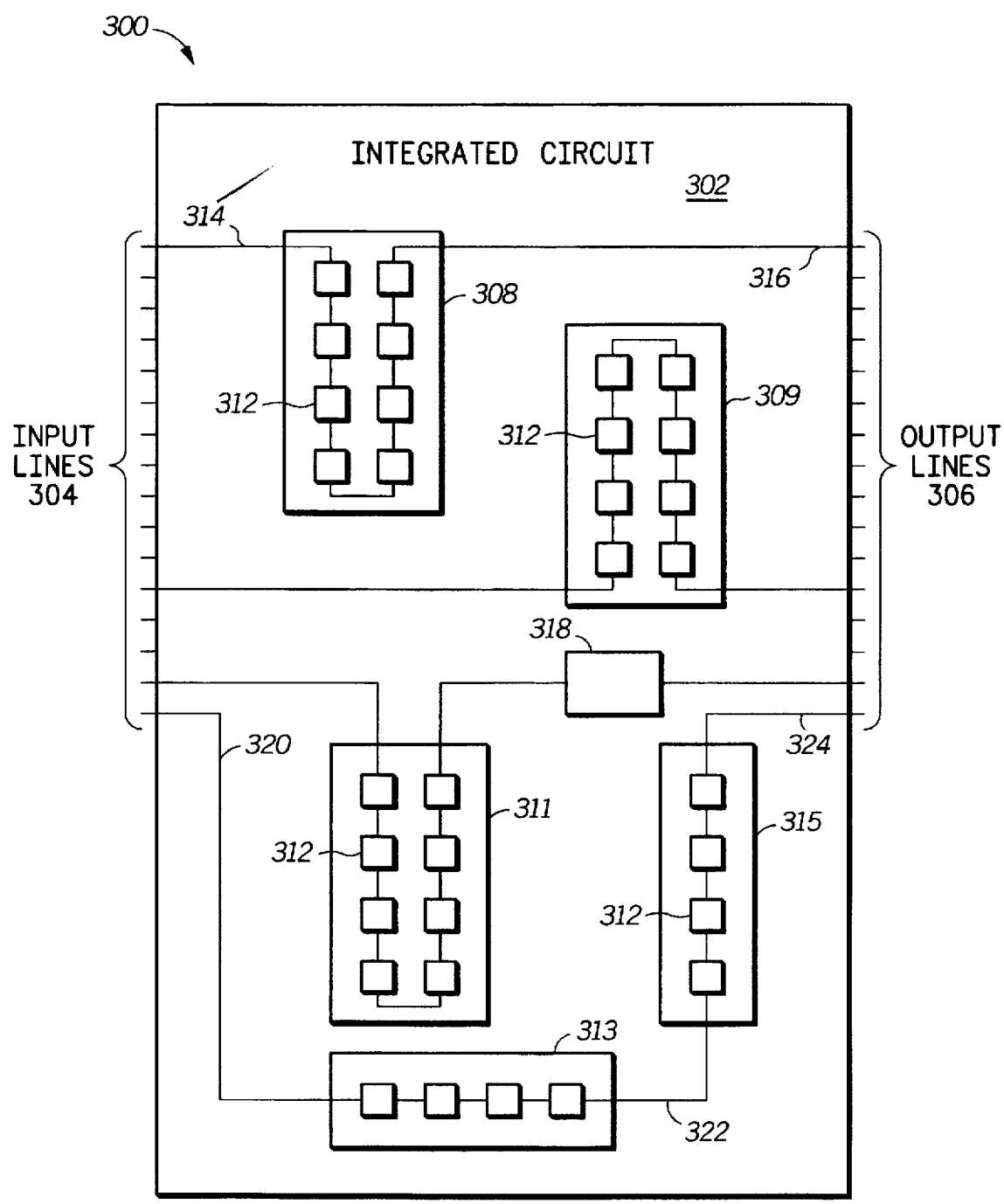
FIG. 12 is a block diagram illustrating a scan data testing structure in accordance with the present invention.

FIG. 12 illustrates a scan data testing structure 300 for providing scan data to a plurality of flip-flops 312 of an integrated circuit 302. The scan data testing structure comprises a plurality of input lines 304, a plurality of output lines 306 and a plurality of scan data paths 314, 316, 320, 322, and 324.

Each of the plurality of input lines 304 receive scan data signals. Each of the plurality of output lines 306 provides scan data signals as well. Preferably, a particular input line of the plurality of input lines 304 corresponds to a particular output line of the plurality of output lines 306. Thus, a tester using the structure described in conjunction with FIG. 12 may provide a series of scan data bits to one of the input lines 304 and receive an output at one of the output lines 306 based upon the input.

Each of the plurality of scan data paths operably couples to one of the plurality of input lines 304 and one of the plurality of output lines 306. Further, each of the plurality of scan data paths sequentially couples to a substantially equal number of flip-flops 312 so as to sequentially provide the scan data signals to the predetermined number of flip-flops. Further, each of the plurality of scan data paths has a substantially equal length. In this fashion, the scan data testing burden on each input line 304 is substantially equal so that a maximum testing rate may be achieved.

Input line 314 provides scan data to subsystem 308 in the integrated circuit 302. The scan data path 314 provides scan data to the eight flip-flops contained within the subsystem 308. The scan data is then provided to output line 316. Thus, a user of the scan data testing structure 300 illustrated in FIG. 12 could verify the operation of each of the eight flip-flops 312 within subsystem 308 by providing scan data to input line 314 and receiving the scan data via the output line 316. Further, as has been previously described, use of the scan data paths within the subsystem 308 of the integrated circuit 302 may be used to verify the logical operation of the logic paths providing input to each of the flip-flops 312 of subsystem 308.

Subsystem 309 may be tested in the same manner as subsystem 308 using the input line and output line connected to subsystem 309. As is shown with respect to subsystems 308 and subsystem 309, each of the subsystems includes eight flip-flops. Thus, there is an exactly equal number of flip-flops in each of the subsystems, each of the subsystems receiving input from a unique input line of the plurality of input lines 304. As one skilled in the art will readily appreciate, however, in a typical system incorporating the teachings illustrated in FIG. 12, many more than eight flip-flops would be coupled to each input line 304. However, for illustrative purposes, only eight flip-flops are shown coupled to each input line 304.

Subsystem 311 includes only seven flip-flops. Thus, in such a situation, the present invention may include adding an additional flip-flop to equalize the number of flip-flops coupled to the particular scan data path. The flip-flop may be a dummy flip-flop or may be from another subsystem.

Further, with reference to subsystems 313 and 315, subsystems may be serially coupled to one another to further equalize the number of flip-flops associated with a particular input line 320 and output line 324. In this situation, connecting line 322 couples the subsystem 313 to subsystem 315.

Input lines 304 provide the dual purpose of providing input data to the integrated circuit as well as providing serial scan data to the integrated circuit. The input lines 304 are preferably multiplexed to provide the scan data and the system data to the flip-flops 312 within the integrated circuit 302. The multiplexing may occur in any mechanism known in the art such that the scan mode and system mode may be selectively enabled. At least some of the input lines 304 provide system data and scan data to a first flip-flop in the respective scan chain over separate data paths, the separate data paths extending from a multiplexor situated at the input line 304 port. However, in this fashion, there is no way to verify the delay time of the logical path between the input line of the plurality of input lines 304 and the first scan flip-flop in the scan chain.

Thus, in some situations it is preferable to use the same input path from one of the plurality of input lines 304 to a non-scan flip-flop which is the first flip-flop in the scan chain. In this fashion, the delay time of the path between the input line to the first flip-flop in the scan chain may be verified simply through varying the frequency of operation of the integrated circuit. The added complexity introduced by the logic circuitry preceding the first flip-flop in the scan chain may be easily compensated for by varying the scan data provided to the input lines 304.

Preferably, each of the flip-flops within the integrated circuit 302 illustrated in FIG. 12 operates on a single clock. The clock signal is distributed via conductive clock structure that provides a clock signal with a minimum skew.

Preferably also, the decisions to combine subsystems within a single scan data path will include considering the size of the subsystem, the location of the subsystem on the integrated circuit 302 so that the scan data paths of the integrated circuit may be further equalized and optimized. In this fashion, the scan mode testing requirements placed on each of the input lines 304 are substantially equal.

Thus, the scan data testing structure 300 illustrated in FIG. 12 provides the important benefit of further increasing the speed at which a complete integrated circuit 302 may be tested in the scan mode. Prior devices provided a single scan data input that would provide scan data to each flip-flop on a chip. However, the structure in FIG. 12 uses a plurality of input lines 304 to provide scan data to the flip-flops 312 within the integrated circuit 302. Another particular structure in addition to that shown in FIG. 12 includes using a common data path between the input lines 304 and a first flip-flop in the scan data path.

Figure 13:
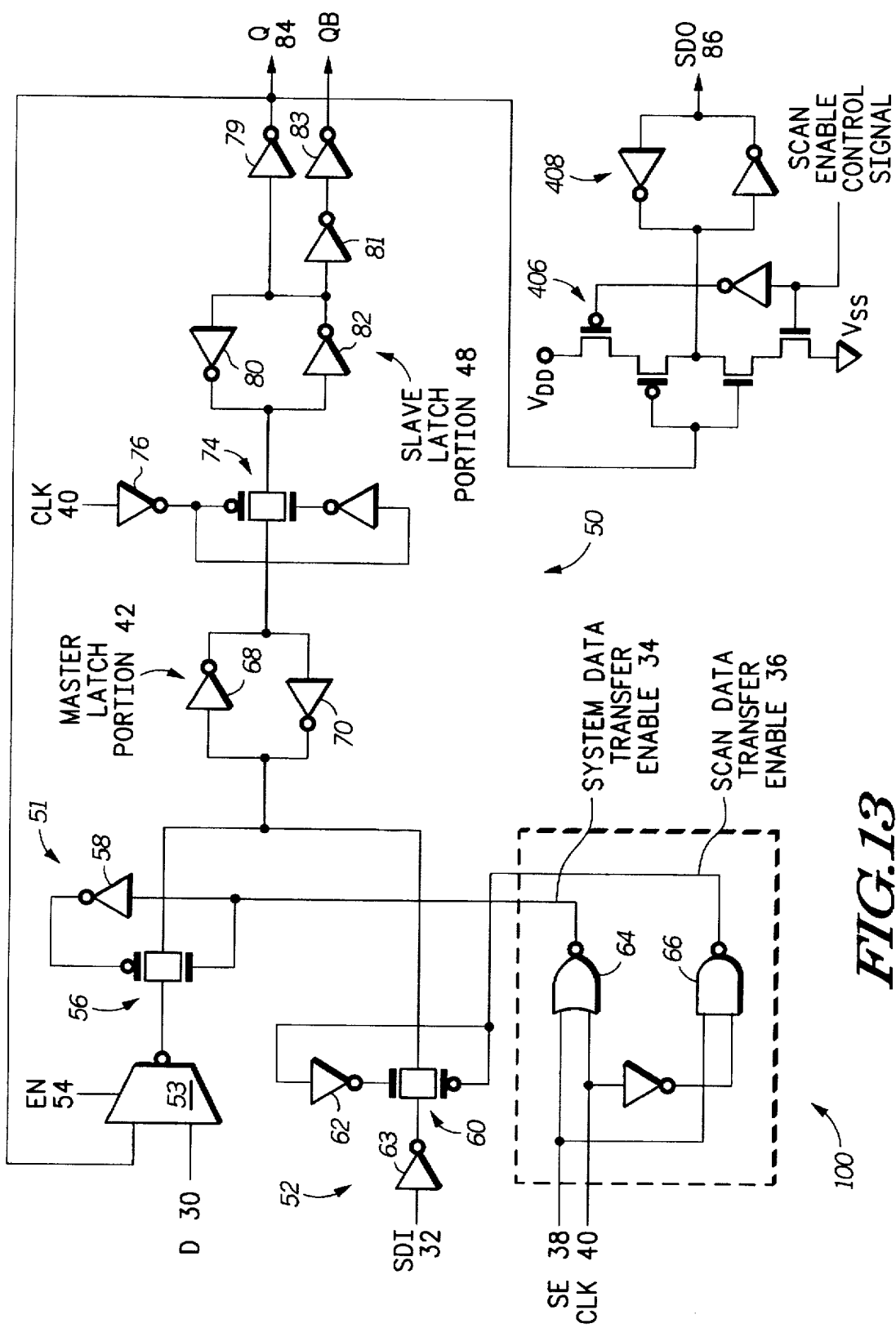
FIG. 13 is a block diagram illustrating an alternate scan data output configuration different from that illustrated in FIG. 3 and in accordance with the present invention.

FIG. 13 illustrates an alternative embodiment to provide for a low power scan data output solution. FIG. 13 illustrates many of the elements of FIG. 3 with identical reference numerals. New elements 406 is used to selectively decouple the SDO line 86 from the Q line 84 when in a normal mode of operation and is used to provide additional current drive. In addition, FIG. 13 uses a keeper circuit 408 (which is a circular coupled pair of inverters) to maintain a stable value on the SDO line 86 when in a normal mode of operation with the circuit 406 disconnecting the Q line 84 from the SDO line 86. This feature allows the SDO line to be decoupled from the Q line when operating to reduce capacitive loading of the functional Q line and serves to reduce power consumption in the system over time.

Figure 14:
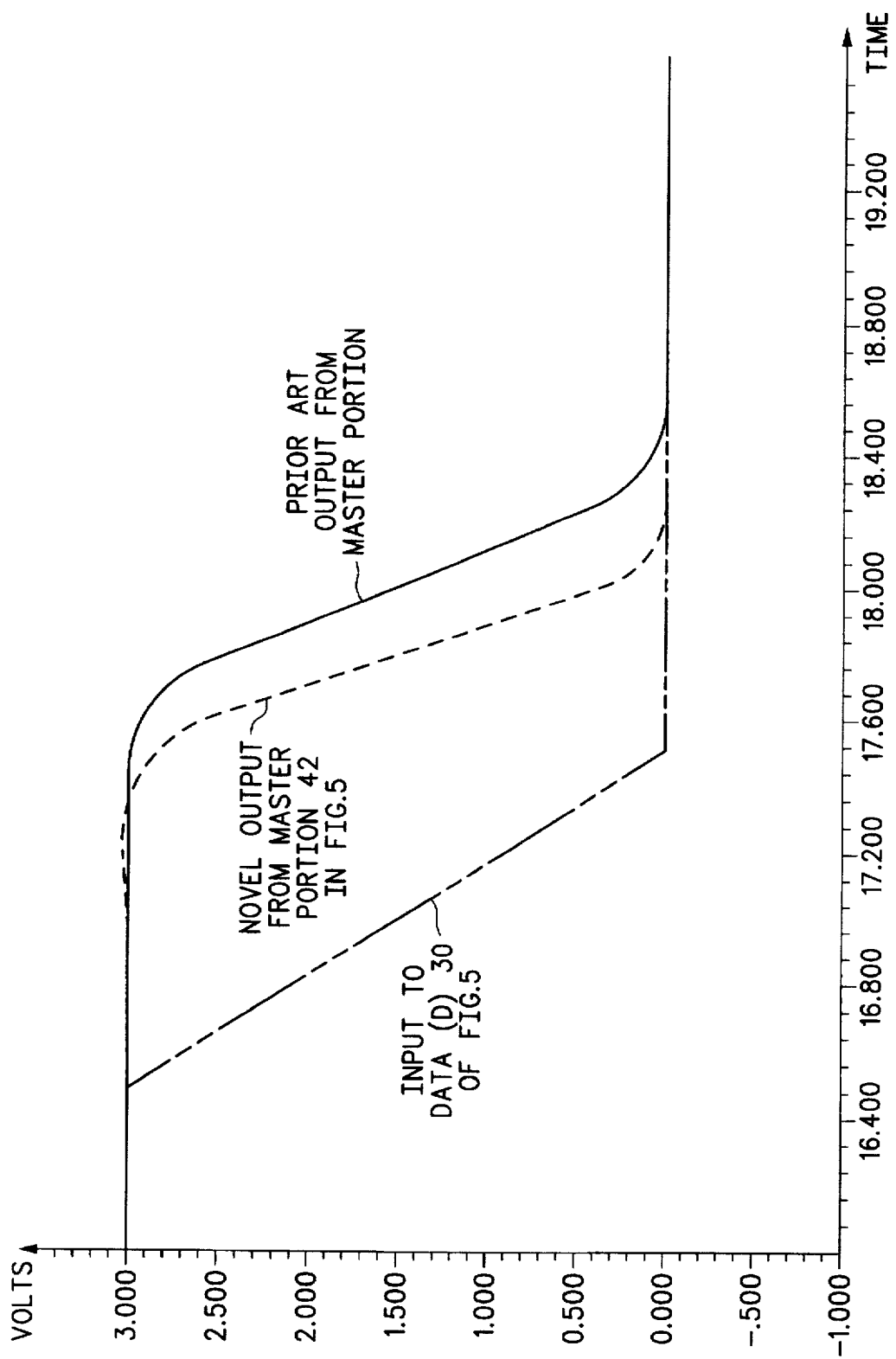
FIG. 14 illustrates, in an X-Y plot, the time saved in terms of D input set up time when using the circuitry of FIG. 3 in place of known circuitry.

FIG. 14 illustrates an X-Y plot where the Y axis is in volts and the X axis is in time. A high-to-low transition (curve 500) is applied to the input data (D) line 30 of FIG. 3, and results in the novel output 502 from the master portion 42 of FIG. 3. Therefore, the distance in time (X-axis) from a middle point of curve 500 to a mid-point of curve 502 is the required set-up time of the novel circuitry of FIG. 3. This set-up time is significantly reduced from the prior art set-up time. The prior art D flip flop scan cells were given the same input of curve 500 which resulted in the prior art master flip-flop portion output as illustrated in curve 506. It was therefore found via experimentation that the use of circuitry, such as the circuitry of FIG. 3, can be used to reduce the D set up time of a scan cell by 10%–25%. In addition, the silicon surface area of the circuit of FIG. 3 which was used for the data of FIG. 14 had an area savings of roughly 5% over the prior art. Therefore, the novel scan cells taught herein can improve D set up time significantly while at the same time reducing circuit area. In many cases, the reduced set-up time of the D input herein will be traded-off for an increased set-up time on the SDI input. However, the system changes discussed herein and efficient layout techniques taught herein for the SDI scan chain allow the greater set-up time for the SDI line to be non-problematic and acceptable to the overall integrated circuit design. In general, even with greater set-up time requirements on the SDI line, at speed scan testing is possible. Therefore, the trade-off of reduced D input set up time for increased SDI input set-up time is very advantageous and desirable.

The above described preferred embodiments are intended to illustrate the principles of the invention, but not to limit the scope of the invention. For example, transfer gates can be changed in size to affect the set-up times of the SDI and D inputs. Various other embodiments and modifications to these preferred embodiments may be made by those skilled in the art without departing from the scope of the following claims.

What is claimed is:

1. An apparatus for providing scan data to a master latch portion of a data storage element wherein the master latch portion is coupled serially to a slave latch portion, the data storage element being one of a plurality of data storage elements of a digital circuit, the apparatus comprising:
   a system data transfer gate directly connected by a conductive element to an input of the master latch portion in order to provide at least one data bit to the master latch portion, wherein the system data transfer gate receives system data and selectively passes the system data to the master latch portion based upon a system data transfer enable signal;
   a scan data transfer gate directly connected by a conductive element to the input of the master latch portion in order to provide at least one scan bit to the master latch portion, wherein the scan data transfer gate receives scan data and selectively passes scan data to the master latch portion based upon a scan data transfer enable signal; and
   a controller operably coupled to the system data transfer gate and the scan data transfer gate, wherein the controller provides the scan data transfer enable signal to the scan data transfer gate upon receipt of an enabled scan enable signal, and wherein the controller otherwise provides the system data transfer enable signal to the system data transfer gate upon receipt of a disabled scan enable signal.

2. The apparatus of claim 1 further comprising:
   a multiplexor operably coupled to an input of the system data transfer gate, wherein the multiplexor selectively provides data storage element content data and system data to the system data transfer gate.

3. The apparatus of claim 1 wherein the controller comprises:
   a first NOR gate, wherein the first NOR gate receives a system clock signal and a scan enable signal, and wherein the first NOR gate provides the system data transfer enable signal; and
   a NAND gate, wherein the NAND gate receives an inverted system clock signal and the scan enable signal, and wherein the NAND gate provides the scan data transfer enable signal.

4. A storage cell having less than three total latch portions, the storage cell comprising:

a master latch portion having an input and an output, wherein the master latch portion contains latch contents;

a slave latch portion coupled to the output of the master latch portion, the slave latch portion having an output;

a first transfer gate having an input for receiving a data signal, an output directly connected by a conductive element to an input of the master latch portion, and a first control input;

a second transfer gate having an input for receiving a scan signal, an output directly connected by a conductive element to the input of the master latch portion, and a second control input;

a controller receiving a clock signal and a scan enable signal, wherein the controller provides a first control signal to the first control input during a first time period, wherein the controller provides a second control signal to the second control input during a second time period, and wherein the first time period is substantially non-overlapping with the second time period;

a scan data output circuit coupled to the output of the slave latch portion.

5. The storage cell of claim 4 further comprising:
   a multiplexor operably coupled to the input of the first transfer gate, wherein the multiplexor selectively provides either data from the output of the latch portion to provide a hold data function or system data to the first transfer gate in a normal operating mode.

6. The storage cell of claim 4 wherein the controller comprises:
   a NOR gate, wherein the NOR gate receives a system clock signal and a scan enable signal, and wherein the NOR gate provides the first control signal; and
   a NAND gate, wherein the NAND gate receives an inverted system clock signal and the scan enable signal, and wherein the NAND gate provides the second control signal.

7. The storage cell of claim 4, wherein the latch portion comprises a portion of a flip-flop selected from a group consisting of a master/slave flip-flop, a D-type flip-flop, a T-type flip-flop, an RS-type flip-flop, and a JK-type flip-flop.

8. The storage cell of claim 4 further comprising either set or reset circuitry for forcing a binary value stored in the latch portion to a predetermined binary state.

9. The storage cell of claim 8, wherein the set or reset circuitry allows a binary manipulation to occur synchronously with a system clock signal.

10. The storage cell of claim 8, wherein the set or reset circuitry allows a binary manipulation to occur asynchronously and independent of a system clock signal.

11. The storage cell of claim 4, wherein the latch portion comprises additional circuitry for providing inverted latch portion data as an output.

12. The storage cell of claim 4, wherein the latch portion comprises three serially coupled inverters for providing both a scan data output and an and inverted data output.

13. A scan chain comprising:
   scan data input port, wherein the scan data input port receives serial scan data;
   a plurality of serially coupled flip-flops operably coupled to the scan data input port, wherein each flip-flop comprises:
      a master latch portion containing two inverters and having an input and an output;
      a slave latch portion having an input coupled to the output of the master latch portion and an output;

a first transfer gate having an input for receiving a data signal, an output directly connected by a conductive element to an input of the master latch portion, and a first control input;

a second transfer gate having an input for receiving a scan signal, an output directly connected by a conductive element to the input of the master latch portion, and a second control input, the output of the second transfer gate and the output of the first transfer gate being directly coupled to each other and directly coupled to the two inverters of the master latch portion; and a controller, wherein the controller provides a first control signal to the first control input during a first time period, wherein the controller provides a second control signal to the second control input during a second time period, wherein the first time period is different from the second time period, and wherein during the second time period, the serial scan data propagates from flip-flop to flip-flop in a serial manner, the first and second control signals being a function of only a clock signal and a scan enable signal; and scan data output port operably coupled to one of the plurality of serially coupled flip-flops, wherein the scan data output port provides output bits of the serial scan data from the scan chain.

14. The scan chain of claim 13 further comprising a plurality of scan data paths, wherein each of the scan data paths operably connects one of the serially coupled flip-flops to a subsequent serially coupled flip-flop in the scan chain, and wherein the plurality of scan data paths are activated to transmit scan data only when the scan chain is enabled.

15. A storage cell having only two latch portions, one latch portion being a slave latch portion and the other latch portion being a master latch portion, the storage cell comprising:

the master latch portion having an input and an output;

the slave latch portion having an input coupled to the output of the master latch portion and an output used to derive a data output, an inverted data output, and a scan data output;

a first transfer gate having an input, an output coupled directly to the input of the master latch portion, and a first control input for receiving a data transfer enable signal;

a second transfer gate having an input, an output coupled directly to the input of the master latch portion and coupled directly to the output of the first transfer gate, and a second control input for receiving a scan transfer enable signal;

a multiplexor having a first input for receiving a data signal, a second input operably coupled to an output of the storage cell, and an output operably coupled to the input of the first transfer gate; and an inverter, wherein the inverter couples a scan data input to the input of the second transfer gate.

16. The storage cell of claim 15, wherein both the first and second control inputs are asserted as a function of a clock signal and a scan enable signal.

17. A storage cell having only two latch portions, one latch portion being a slave latch portion and the other latch portion being a master latch portion, the storage cell comprising:

the master latch portion having an input and an output;

the slave latch portion having an input coupled to the output of the master latch portion and an output used to derive a data output and a scan data output;

a first transfer gate having an input for selectively receiving a functional data signal, an output coupled directly to an input of the master latch portion, and a control input for receiving a data enable signal;

a second transfer gate having an input for receiving a scan data signal, an coupled directly to the master latch portion and coupled directly to the output of the first transfer gate, and a control input for receiving a scan enable signal; and operable coupling, wherein the operable coupling couples an output of the storage cell to the input of the first transfer gate.

18. The storage cell of claim 17, wherein the output of the latch portion is coupled through a third transfer gate to slave latch portion.

19. A storage element comprising:

a master latch portion for storing a binary value, the master latch portion having an input and an output, the master latch portion having a first inverter and a second inverter wherein an output of first inverter is coupled directly to an input of the second inverter and wherein an input of first inverter is coupled directly to an output of the second inverter;

a data transfer gate having an input and an output wherein the output is directly connected to the input of master latch portion, the data transfer gate having a control input which selectively turns the data transfer gate on or off;

a multiplexor having a first input, a second input, and an output wherein the output is directly connected to the input of the data transfer gate, the first input of the multiplexor receiving system data and the second input of the multiplexor receiving hold data which is a function of a data bit stored in the master latch portion; and a logic gate receiving a scan enable control signal as input and a clock signal as input and providing a control signal to the control input of the data transfer gate.

20. The storage element of claim 19 wherein the logic gate is a two-input NOR gate.

21. The storage element of claim 19 wherein the multiplexor is an inverting multiplexor.

22. The storage element of claim 19 wherein slave latch portion is coupled to the master latch portion and an output of the slave latch portion provides the hold data.

23. The storage element of claim 19 wherein a scan transfer gate is coupled to the output of the data transfer gate, the scan transfer gate being used to provide scan data to the master latch portion in a manner mutually exclusive in time to the system data.

24. The storage element of claim 23 wherein the scan enable control signal is used to determine whether the scan transfer gate is enabled or the data transfer gate is enabled.

25. A storage cell comprising:

slave storage means for storing a binary value, the binary value being provided to the slave storage means via a data input and provided from the slave storage means via a data output when in a normal mode of operation;

a gate having an input coupled to the data output and an output for providing a scan data output wherein the gate can be selectively disconnected from a power supply and a ground supply;

a keeper circuit coupled in series with the scan data output to ensure that a value on the scan data output is stable when the gate is disconnected from the power supply and the ground supply; and wherein the gate is disconnected from the power supply and the ground supply when the storage cell is in the normal mode of operation to reduce capacitive loading on the data output of the slave storage means.

26. The storage cell of claim 25 wherein the keeper circuit is a first inverter having an input and an output and a second inverter having an input and an output wherein the input of the first inverter is coupled to the output of the second inverter and the input of the second inverter is coupled to the output of the first inverter.

27. A storage cell comprising:

a master latch portion having an input and an output;

a first N channel transistor, a second N channel transistor, and a third N channel transistor coupled in series between the input of the master latch portion and a ground conductor;

a first P channel transistor, a second P channel transistor, and a third P channel transistor coupled in series between the input of the master latch portion and a power supply conductor;

a clock conductor coupled to a gate electrode of the first N channel transistor and a gate electrode of the first P channel transistor;

a scan enable control signal conductor coupled to a gate electrode of the second N channel transistor and a gate electrode of the second P channel transistor; and a scan enable data conductor coupled to a gate electrode of the third N channel transistor and a gate electrode of the third P channel transistor, wherein the first, second, and third N channel transistors and the first, second, and third P channel transistors selectively provide a scan data signal to the input of the master latch portion.

* * * * *